US010000381B2

(12) United States Patent
Moseley et al.

(10) Patent No.: US 10,000,381 B2
(45) Date of Patent: Jun. 19, 2018

(54) SYSTEMS AND METHODS FOR GROWING A NON-PHASE SEPARATED GROUP-III NITRIDE SEMICONDUCTOR ALLOY

(71) Applicant: GEORGIA TECH RESEARCH CORPORATION, Atlanta, GA (US)

(72) Inventors: Michael William Moseley, Atlanta, GA (US); William Alan Doolittle, Hampton, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days. days.

(21) Appl. No.: 14/860,226

(22) Filed: Sep. 21, 2015

(65) Prior Publication Data
US 2016/0009556 A1    Jan. 14, 2016
US 2018/0118568 A9    May 3, 2018

Related U.S. Application Data

(63) Continuation of application No. 13/883,566, filed as application No. PCT/US2011/059793 on Nov. 8, 2011, now Pat. No. 9,142,413.
(Continued)

(51) Int. Cl.
*H01L 29/30*        (2006.01)
*C01B 21/06*        (2006.01)
(Continued)

(52) U.S. Cl.
CPC .......... *C01B 21/0632* (2013.01); *C30B 23/02* (2013.01); *C30B 29/403* (2013.01);
(Continued)

(58) Field of Classification Search
USPC ................ 106/286.1, 0.5; 428/697, 698, 699
See application file for complete search history.

(56) References Cited

U.S. PATENT DOCUMENTS 5,773,853 A    6/1998   Saito
6,345,063 B1*  2/2002   Bour ...................... H01L 33/32
                                                    257/14
(Continued)

OTHER PUBLICATIONS

O'Donnell et al "Structural analysis of InGaN epilayers" J. Phys Cons Matter 12 (2007) p. 6977-6991.*
(Continued)

*Primary Examiner* — Archene Turner
(74) *Attorney, Agent, or Firm* — Troutman Sanders LLP

(57) ABSTRACT

Systems and methods for MBE growing of group-III Nitride alloys, comprising establishing an average reaction temperature range from about 250 C to about 850 C; introducing a nitrogen flux at a nitrogen flow rate; introducing a first metal flux at a first metal flow rate; and periodically stopping and restarting the first metal flux according to a first flow duty cycle. According to another embodiment, the system comprises a nitrogen source that provides nitrogen at a nitrogen flow rate, and, a first metal source comprising a first metal effusion cell that provides a first metal at a first metal flow rate, and a first metal shutter that periodically opens and closes according to a first flow duty cycle to abate and recommence the flow of the first metal from the first metal source. Produced alloys include AlN, InN, GaN, InGaN, and AlInGaN.

13 Claims, 11 Drawing Sheets

Related U.S. Application Data

(60) Provisional application No. 61/411,155, filed on Nov. 8, 2010.

(51) Int. Cl.
 *C30B 23/02* (2006.01)
 *C30B 29/40* (2006.01)
 *H01L 21/02* (2006.01)
 *H01L 21/205* (2006.01)
 *H01L 29/20* (2006.01)

(52) U.S. Cl.
 CPC ........ *C30B 29/406* (2013.01); *H01L 21/0237* (2013.01); *H01L 21/0254* (2013.01); *H01L 21/02631* (2013.01); *H01L 21/2056* (2013.01); *H01L 29/2003* (2013.01); *H01L 29/30* (2013.01); *C01P 2006/40* (2013.01); *C01P 2006/90* (2013.01)

(56) References Cited

U.S. PATENT DOCUMENTS

| | | | | |
|---|---|---|---|---|
| 6,596,079 | B1* | 7/2003 | Vaudo | C30B 23/00 117/101 |
| 7,154,163 | B2* | 12/2006 | Hon | H01L 21/0237 257/615 |
| 2003/0146433 | A1 | 8/2003 | Cantwell | |
| 2006/0126688 | A1* | 6/2006 | Kneissl | B82Y 20/00 372/43.01 |
| 2007/0105259 | A1* | 5/2007 | Won | C30B 25/02 438/46 |
| 2007/0111488 | A1* | 5/2007 | Chakraborty | B82Y 20/00 438/478 |
| 2010/0176490 | A1 | 7/2010 | Letertre | |
| 2010/0187497 | A1* | 7/2010 | Nago | H01L 33/32 257/13 |
| 2011/0284863 | A1* | 11/2011 | Lindow | H01L 21/0237 257/76 |

OTHER PUBLICATIONS

Guo et al "Quaternary InAlGaN-based multi-quantum wells for ultraviolet light emmitting diode applciation" SPIE vol. 4776 (2002) p. 18-25.*

International Search Report and Written Opinion dated Feb. 21, 2012 for priority application PCT/US2011/059793.

Trybus: 'Molecular Beam Epitaxy Growth of Indium Nitride and Indium Gallium Nitride Materials for Photovoltaic Applications' PH.D. Dissertation May 2009, p. 14.

* cited by examiner

SYSTEMS AND METHODS FOR GROWING A NON-PHASE SEPARATED GROUP-III NITRIDE SEMICONDUCTOR ALLOY

CROSS REFERENCE TO RELATED APPLICATIONS

This application is a continuation of U.S. patent application Ser. No. 13/883,566, filed 4 May 2013, which is a U.S. National Stage of International Application No. PCT/US2011/059793, filed 8 Nov. 2011, which claims the benefit of U.S. Provisional Patent Application Ser. No. 61/411,155 filed 8 Nov. 2010, entitled, "Non-Phase Separated InGaN For Use in Light-Emitting Diodes, LASERs, and Solar Cells," the entire contents and substance of each hereby incorporated by reference.

BACKGROUND OF THE INVENTION

1. Field of the Invention

The present invention relates generally to group-III Nitride semiconductor alloys and system and methods for manufacturing same.

2. Description of the Related Art

Since the understanding of the physics of the blue light emitting diode, ("LED"), the nitride materials system has been meticulously investigated for its applications in optoelectronic devices. Group-III Nitride semiconductor alloys, such as Indium-Gallium-Nitride ("InGaN") alloys, are researched because the direct band gap of InGaN can be tuned to allow emission or absorption from the entire visible spectrum by adjusting the indium content. Specifically, the tunable direct band gap of InGaN between 0.7 eV (InN) and 3.4 eV (GaN) makes this alloy particularly intriguing for both light-emitting and photovoltaic materials. High breakdown fields common among all group-III nitrides have been exploited for currently commercialized high-power electronics. These strengths could be further utilized in space applications due to the substantial radiation hardness of InGaN.

Currently, there exists no native substrate for InGaN growth. Inherently, InN has different lattice spacings than GaN, and thus no conventional substrate can be completely lattice matched to all alloys of InGaN. InGaN LED structures are typically grown by metalorganic chemical vapor deposition ("MOCVD") on sapphire or SiC substrates that have substantial lattice mismatches to all nitride alloys. The dislocations created by this mismatch are partially mitigated by preparing GaN templates, which reduce or eliminate many defects by growing a thick, GaN buffer. This technique allows for the growth of thin, low indium content InGaN quantum wells to be grown completely strained and without relaxation on the thick GaN layers. Although the use of a GaN template only reduces dislocations in GaN for standard, e.g. .about.4 .mu.m, buffer layer thicknesses to $10.^{8}$-$10.^{9}$ cm.$^{3}$, GaN-based LEDs still exhibit very high efficiencies due to localization of carriers in quantum wells. However, higher indium content quantum wells to push light emission further into the green will strain relax, producing more non-radiative recombination centers. This technique provides a solution for violet and blue LEDs, but both lower wavelength emission and more complex structures such as solar cells and laser diodes require a different approach for the substrate of InGaN. Although there are commonly used methods to circumvent, or at least ameliorate, lattice matching issues to utilize InGaN in violet/blue LEDs, there still exist some core material properties that make high-quality, high indium content InGaN difficult to grow using conventional processes.

InGaN alloys tend to have some form of phase separation through three main degradation processes: thermal decomposition, spinodal decomposition, and indium surface segregation. Although thermal decomposition is a factor in a typical growth process for group-III nitride materials, the effects can be significant for InGaN growth depending on growth conditions. The bonds between indium and nitrogen are weaker than that of gallium and nitrogen, so less energy in the form of heat is required for the bonds to break. In other words, in processes that require a certain temperature to form GaN, the temperature can be detrimental to maintaining the InN bonds formed because the higher temperature increases the probability that the InN bonds will separate. Because of the inherent temperature limitations in growing InGaN alloys, this property introduces inherent process limitations. For example, MOCVD growth uses elevated temperatures to crack ammonia into nitrogen. The relatively high-temperature process of MOCVD during InGaN growth has been shown to cause the dissociation of indium from the InGaN alloy, leaving excess indium metal on the surface. But, if the temperature were reduced in an effort to reduce the dissociation of indium, not only would less reactive nitrogen be available, causing less than ideal growth nitrogen content in the reaction chamber, but the material quality would also suffer because, as less energy is supplied, the energy available to the reactant atoms to find optimal locations in the crystal lattice would be reduced.

Another factor in the growth of InGaN alloys is spinodal decomposition. Spinodal decomposition occurs when phases of materials undesirably separate due to low energy barriers. This is especially problematic for InGaN alloys because InGaN alloys have a region between the InN and GaN phases that, at certain temperatures and indium compositions, has no energy barrier for phase separation. This can cause both minor indium compositional fluctuations as well as two completely separated, more energetically favorable, phases. Complex structures, such as solar cells and laser diodes, require both smooth band structures and very low dislocation densities, both inconsistent with alloys affected by spinodal decomposition. Spinodal decomposition is typically considered a kinetically limited effect, occurring primarily on the surface as bulk diffusion in nitrides is very low.

Indium surface segregation is perhaps the most disruptive of the natural limitations of the nitride materials system. Indium surface segregation can be described as the tendency of indium atoms to preferentially migrate vertically along the growth front and laterally across the film during the growth of InGaN alloys. Vertical indium surface segregation is the competition between indium and gallium on the film surface, where it is more energetically favorable for gallium atoms to occupy surface sites. The vertical surface segregation of indium has been shown to result in a decrease in indium incorporation and blurring of InGaN/GaN interfaces in quantum well growth. A result of the vertical surface segregation, vertical inhomogeneities in quantum wells, negatively impact light emission due to wider well width, causing less than ideal electron-hole wave function overlap.

Lateral segregation of indium is caused by the higher stability of In—In bonds than In—Ga bonds, encouraging indium to laterally aggregate into islands (or pools) if given enough time and mobility on the surface. This migration of indium absorbed atoms ("adatom"s) into clusters on the growing surface has been shown to produce indium-rich nanostructures within the film. Unlike vertical indium surface segregation, lateral surface segregation has been shown to increase light emission from indium-bearing materials. The quantum-dot-like nanostructures created from this form of indium surface segregation have been shown to enhance spatial carrier localization, producing radiative recombination centers. Although perhaps beneficial for LEDs and laser diodes, lateral surface segregation of indium is detrimental for nitride solar cells, where recombination of carriers is preferentially minimized.

To ameliorate limitations caused by segregation, some conventional processes use indium-rich conditions. Indium-rich conditions have been used in the growth of GaN, and InN, where indium adlayers have proven to be useful as a surfactant without affecting material compositions. However, for the case of InGaN, excess indium accumulation has a significant effect on indium incorporation. At the temperatures generally used for InGaN growth, metallic indium has been shown to be difficult to remove from the growth surface in situ without causing heat-induced phase separation, i.e. spinodal decomposition, of the InGaN alloy. Suppression of indium surface segregation has been conventionally achieved by the use of nitrogen-rich growth conditions. But the use of nitrogen-rich growth conditions can prohibit a metal adlayer from accumulating on the growing surface, resulting in a reduction in material quality and surface smoothness. To compensate for issues presented in metal-rich conditions, stoichiometric growth conditions can be used to increasing crystal quality and surface smoothness. But stoichiometric growth conditions are often difficult to achieve uniformly across large wafers at temperatures used for InGaN growth where an intermediate regime does not exist.

In addition to MOCVD, there are other conventional methods for growing InGaN alloys. Molecular beam epitaxy ("MBE") is a method of growing layers of various materials in a high vacuum or ultra-high vacuum environment. U.S. Pat. No. 7,115,167 discloses the growth of InGaN alloys in a high vacuum growth chamber at temperatures ranging from 650.degree. C. to 850.degree. C. using gaseous ammonia as the source of reactive nitrogen. The nitrogen in the ammonia is separated from the hydrogen atoms through a process called "cracking". Energy is supplied to the ammonia molecule in the form of heat as the ammonia lands on the growth surface of the substrate, causing the ammonia molecule to break apart. The nitrogen is reactive with at least a portion forming a nitride film.

Typically, the hydrogen portion of the ammonia quickly evaporates from the growth surface and does not appreciably affect the growth. High temperatures are used in the MBE process to produce enough reactive nitrogen for appreciable growth. But, because of the relatively high temperatures used in the MBE process, the alloy formed typically will experience conditions favorable to thermal and spinodal decomposition, reducing the quality of the alloy or preventing the desired indium content. U.S. Pat. No. 7,608,532 discloses a different method using a variation of chemical vapor deposition ("CVD"). The reactive nitrogen source also is ammonia with typical process temperature ranges exceeding those commonly found in MBE processes, also introducing conditions favorable to at least thermal and spinodal decomposition.

It can be seen that there remains a need for an InGaN alloy growth process that achieves the goal of high indium content alloys while accounting for the effects of thermal decomposition, spinodal decomposition, and indium surface segregation. There also remains a need for relatively fast indium growth to alleviate the issues of spinodal decomposition, which is considered a kinetically limited effect. It is to the provision of such a process that the present invention is primarily directed.

BRIEF SUMMARY OF THE INVENTION

Briefly described, in an exemplary form, the present invention is a group-III Nitride semiconductor alloy growth process using lower temperatures while achieving higher growth rates than found in conventional group-III Nitride growth processes. The present invention improves upon conventional processes by periodically modulating the metal flux in metal-rich group-III Nitride growth while maintaining a constant nitrogen flux. In an exemplary embodiment, one or more metal effusion cells are periodically closed during processing, allowing for the consumption of excess metal present on the surface into the alloy. This helps to reduce the probability of metallic droplets forming on the surface, while still taking advantage of enhanced adlayer mobility provided by the excess metal. Further, the lower growth temperatures of various embodiments of the present invention can help make quaternaries, i.e. four-element alloys, practical, whereas in conventional growth technologies, the higher temperatures used sometime impede or reduce the practicality of growing quaternaries.

According to another exemplary embodiment, the present invention is a method for growing a group-III Nitride semiconductor alloy, the method comprising establishing an average reaction temperature range from about 250.degree. C. to about 850.degree. C., introducing a nitrogen flux at a nitrogen flow rate and a first metal flux at a first metal flow rate, establishing a plasma, and periodically stopping and restarting the first metal flux according to a flow duty cycle to produce the group-III Nitride semiconductor alloy. In some embodiments, the first metal includes, but is not limited to, gallium, aluminum, and indium. In still further embodiments, the group-III Nitride semiconductor alloy is a buffer layer upon which one or more additional semiconductor alloys are to be grown. In a still further embodiment, the method further comprises introducing a second metal flux at a second metal flow rate, wherein the first metal flux is periodically stopped and restarted according to the flow duty. In some embodiments, the second metal flux includes, but is not limited to, indium, gallium and aluminum. In some embodiments, the first metal flux and the second metal flux are started and stopped through the use of shutters at the output of the first metal effusion cell and second metal effusion cell, respectively. It should be noted, however, that the present invention is not limited to the use of shutters and can include the use of other flow abatement means such as, but not limited to, output valves.

According to another exemplary embodiment, the present invention is a method comprising providing a growth substrate, establishing an average substrate temperature range from about 250.degree. C. to about 850.degree. C., introducing a nitrogen flux at a nitrogen flow rate and a gallium flux at a first gallium flow, establishing a plasma, growing a gallium-nitride buffer layer on the substrate, introducing an indium flux at an indium flow rate and a gallium flux at a second gallium flow rate and an aluminum flux at an aluminum flow rate, and periodically stopping and restarting the indium flux and the gallium flux and the aluminum flux according to a flow duty cycle to produce the indium-nitride/gallium-nitride/aluminum-nitride alloy. It should be noted that other binaries, such as, but not limited to, AlN, GaN, InN, or other alloys such as, but not limited to, AlInGaN, can be used as a buffer.

According to another exemplary embodiment, the present invention is a method comprising establishing an average substrate temperature range preferably from about 250.degree. C. to about 850.degree. C., introducing a nitrogen flux at a nitrogen flow rate and a gallium flux at a first gallium flow rate, introducing an indium flux at an indium flow rate and a gallium flux at a gallium flow rate and an aluminum flux at an aluminum flow rate, and periodically stopping and restarting the indium flux and the gallium flux and the aluminum flux according to a flow duty cycle to produce the indium-nitride/gallium-nitride/aluminum-nitride alloy.

According to a still further exemplary embodiment of the present invention, the present invention is a system for growing an indium-gallium-aluminum-nitride alloy comprising a nitrogen source that provides nitrogen at a nitrogen flow rate, a gallium source comprising a gallium effusion cell that provides gallium at a gallium flow rate and a gallium shutter, a heat source that establishes an average substrate temperature range preferably from about 250.degree. C. to about 850.degree. C., an indium source comprising an indium effusion cell that provides indium at an indium flow rate and an indium shutter, an aluminum source comprising an aluminum effusion cell that provides aluminum at an aluminum flow rate and an aluminum shutter, wherein the gallium shutter and the indium shutter and the aluminum shutter are configured to periodically open and close according to a flow duty cycle to abate and recommence the flow of indium from the indium source and the flow of gallium from the gallium source and the flow of aluminum from the aluminum source to produce the indium-gallium-aluminum-nitride alloy.

According to a further exemplary embodiment, the present invention is a system comprising growing a group-III Nitride semiconductor alloy, the system comprising a nitrogen source that provides nitrogen at a nitrogen flow rate, and a first metal source comprising a first metal effusion cell that provides a first metal at a first metal flow rate and a first metal shutter that periodically opens and closes according to a first flow duty cycle to abate and recommence the flow of the first metal from the first metal source. In some embodiments, the first metal is selected from the group consisting of gallium, indium, and aluminum. In some embodiments, the system further comprises a second metal source comprising a second metal effusion cell that provides a second metal at second metal flow rate and a second metal shutter that periodically opens and closes according to a second flow duty cycle to abate and recommence the flow of the second metal from the second metal source. In some embodiments, the first metal and the second metal are selected from the group consisting of gallium, indium, and aluminum. In some embodiments, the system further comprises a third metal source comprising a third metal effusion cell that provides a third metal at third metal flow rate and a third metal shutter that periodically opens and closes according to a third flow duty cycle to abate and recommence the flow of the third metal from the third metal source. In some embodiments, the first metal, the second metal, and the third metal are selected from the group consisting of gallium, indium, and aluminum.

In some embodiments, an average substrate temperature range or an average reaction temperature range is used and preferably ranges from about 250.degree. C. to about 850.degree. C., more preferably from about 300.degree. C. to about 800.degree. C., and most preferably from about 350.degree. C. to about 750.degree. C.

Various embodiments of the present invention further comprise the use of a reflection high-energy electron diffraction apparatus for providing an in situ analysis of transient intensities.

These and other objects, features, and advantages of the present invention will become more apparent upon reading the following specification in conjunction with the accompanying drawing figures.

DETAILED DESCRIPTION OF PREFERRED EMBODIMENTS

Figure 1:
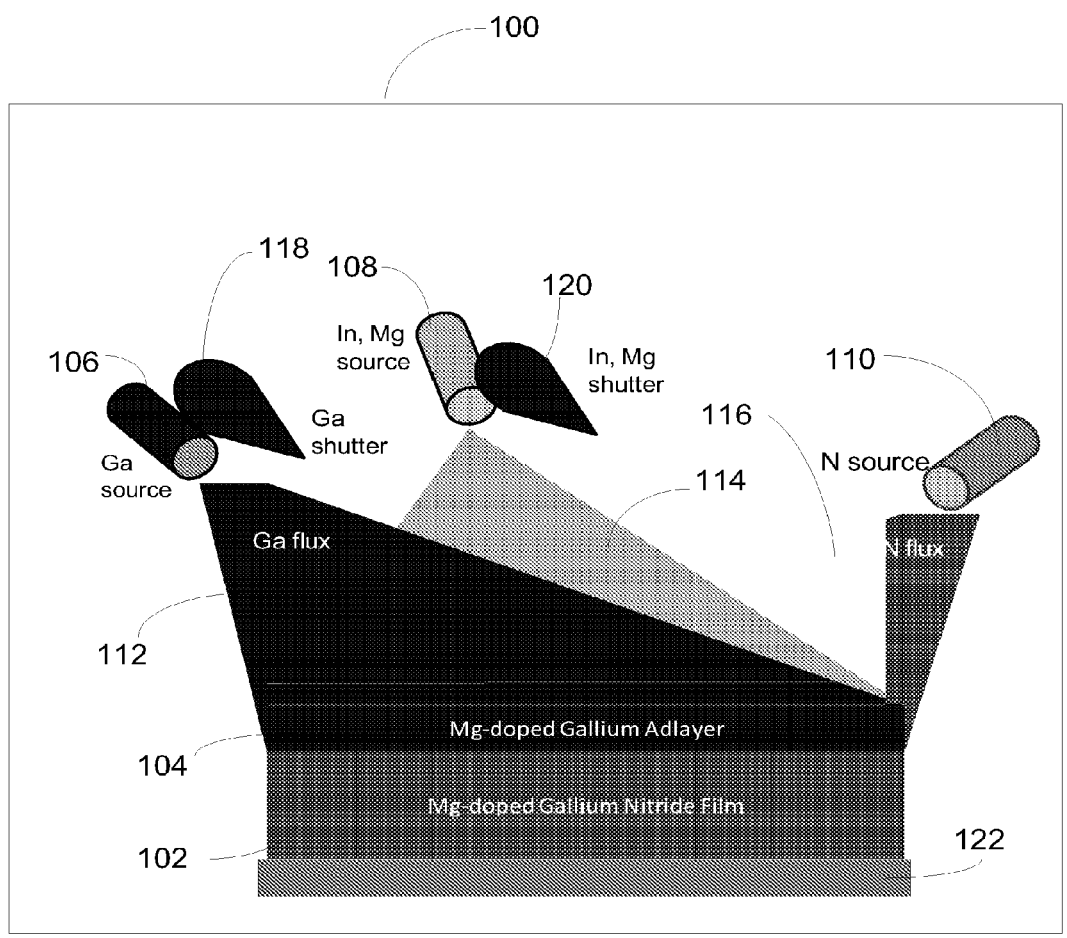
FIG. 1 illustrates an exemplary reaction chamber for growing an aluminum-indium-gallium-nitride alloy, according to various embodiments of the present invention.

Although preferred embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" one particular value and/or to "about" or "approximately" another particular value. When such a range is expressed, another embodiment includes from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

In some embodiments, the present invention is directed to a relatively faster growth process when compared to conventional growth processes. In some embodiments, the present invention emphasizes the monitoring of adlayer accumulation. Various embodiments of the present invention can provide increased crystal quality and grain sizes and provide single-phase, group-III Nitride semiconductor alloy layers throughout the miscibility gap. In one exemplary embodiment, the present invention is a semiconductor growth process in which metal fluxes are periodically modulated, or shuttered, according to a duty cycle. As used herein, the process is termed Metal-Modulated Epitaxy ("MME"). In various embodiments, the MME process of the present invention can also use "metal-rich" fluxes. In still further embodiments, the processing temperature of the present invention is relatively lower when compared to conventional group-III nitride growth processes such as MOCVD and MBE. An aspect of some embodiments of the present invention is the abatement and resumption of the metal fluxes during the growth processes while maintaining the nitrogen flux constant. The flow of the metal fluxes from the metal effusion cells can be periodically stopped and restarted at certain times during adlayer accumulation in order to limit excess metal dose on the growth surface.

Various embodiments of the present invention can also provide for wide substrate growth temperature ranges. In some examples, InGaN can been grown as low as 250.degree. C. and AlN can be grown as hot as 850.degree. C. The large window of substrate temperatures of the present invention provides for conditions that are cold enough to substantially avoid the intermediate regime, known to cause pitting in the growth surface. Furthermore, adlayer desorption in the intermediate regime results in an exponential metal adsorbate dependence on substrate temperature. Colder, non-intermediate regime growth thus inhibits substrate temperature related fluctuations in growth conditions.

FIG. 1 is an illustration of an exemplary growth system that can be used to grow InGaN according to various embodiments of the present invention. Although the following describes the present invention in the context of growing group-III Nitride semiconductor alloy, including InGaN semiconductor alloys, it should be understood that the present invention is not limited to any specific group-III Nitride alloy such as InGaN, but rather, encompasses the growth of other group-III Nitride semiconductor alloys including, but not limited to, InN, GaN, AlN, InGaAlN, all of which are considered to be within the scope of the present invention. Further, the present invention is not limited to the use of gallium, indium, aluminum, but may also include other metals or elements with functional and/or physical properties that are analogous to the aforementioned metals, gallium, indium, aluminum.

Returning to FIG. 1, a first step in an exemplary embodiment is to deposit nitride film 102 onto substrate 122. Substrate materials can include, but are not limited to, silicon, silicon carbide, sapphire, germanium, zinc oxide, lithium gallate, lithium tantalate, and lithium niobate.

For example, lithium gallate can be a favorable substrate for nitride film 102 over sapphire due to lithium gallate's 1% lattice mismatch versus sapphire's 14-16% lattice mismatch. The dislocations created by this mismatch are partially mitigated by preparing GaN templates, which reduce or eliminate many defects by growing nitride film 102.

However, in conventional processes, lithium gallate can decompose at the relatively higher temperatures used. In some embodiments of the present invention, because of the relatively lower temperature available for processing, lithium gallate can be used because the temperature is low enough where volatile substrates such as lithium gallate become feasible. Various embodiments of the present invention can provide for the growth of thin, low indium content InGaN quantum wells to be grown completely strained and without relaxation on the thick GaN layers. In some embodiments, nitride film 102 is grown by initiating nitrogen flux 116 from nitrogen source 110 and gallium flux 112 from gallium effusion cell 106 and periodically stopping and starting gallium flux 112 according to a flow duty cycle. In other embodiments, nitride film 102 is grown via conventional growth processes such as MOCVD and MBE. In some embodiments, it can be desirable to dope nitride film 102 with magnesium to produce a p-type (hole conducting) layer.

Effusion cells 106, 108 and nitrogen source 110 provide an input of gallium flux 112, indium flux 114 and nitrogen flux 116, respectively. Once nitride film 102 is grown, metal adlayer 104 is periodically deposited with gallium and indium (and in the alternative, aluminum) via gallium effusion cell 106 and indium effusion cell 108. Gallium adlayer 104 is nitrided by nitrogen source 110. As previously discussed, it is generally preferable to grow InGaN alloys at relatively lower temperatures because of the lower energy necessary to break the InN bonds when compared to compared to the GaN bonds in the InGaN alloy. But, as less energy is supplied, the energy available to the reactant atoms to find optimal locations in the crystal lattice would be reduced. In order to achieve higher levels of indium in the InGaN alloy, conventional processes increase the metal flux to the highest levels feasible, even though increased metal flux can increase the probability of indium surface segregation, thereby reducing the indium content in the alloy. In some embodiments, it can be desirable to use different metals or infuse an additional metal to change the characteristics of the group-III Nitride semiconductor alloy. For example, an aluminum effusion cell (not illustrated) can be provided to grow aluminum-bearing semiconductor alloys such as, but not limited to, AlN, AlInGaN, and AlGaN.

Various flux flow rates can be established to change the percentage indium in the InGaN alloy. In one example, the flow rate of nitrogen is 1.3 standard cubic centimeters per second and can be scaled with the deposition/growth area. In that example, to grow 22% InGaN, an indium flux of 2.3E-7 Torr beam equivalent pressure and a gallium flux of 6.0E-7 Ton beam equivalent pressure, or a ratio of indium flux to gallium flux of approximately 1:2.6, can be used. For 32% InGaN, an indium flux of 3.5E-7 Torr beam equivalent pressure and a gallium flux of 5.2E-7 Torr beam equivalent pressure, or a ratio of indium flux to gallium flux of approximately 1:1.48, can be used. For 45% InGaN, an indium flux of 4.8E-7 Torr beam equivalent pressure and a gallium flux of 4.4E-7 Torr beam equivalent pressure, or a ratio of indium flux to gallium flux of approximately 1.1:1, can be used. For 62% InGaN, an indium flux of 7.6E-7 Torr beam equivalent pressure and a gallium flux of 2.6E-7 Torr beam equivalent pressure, or a ratio of indium flux to gallium flux of approximately 2.93:1, can be used. For 72% InGaN, an indium flux of 8.3E-7 Torr beam equivalent pressure and a gallium flux of 2.2E-7 Torr beam equivalent pressure, or a ratio of indium flux to gallium flux of approximately 3.77:1, can be used. Some embodiments of the present invention provide for the ability to predict the final composition of the alloy, as the effect of desorption of the metals from the alloy is minimized or negated.

To facilitate both lower processing temperature and to increase the rate at which indium is incorporated into the alloy, while reducing the probability of indium surface segregation, embodiments of the present invention shutter, or abate and resume, gallium flux 112 and indium flux 114 at periodic intervals, while maintaining nitrogen flux 116 constant. Stopping and restarting gallium flux 112 and indium flux 114 limits the excess metal adlayer 104 on the surface of nitride film 102 and provides time to allow the excess metal to be consumed within the crystalline matrix of Nitride film 102. In p-type GaN, or other group-III Nitride semiconductor alloys such as AlInGaN, a less Group-III metal-rich flux is used in order to suppress compensating N-vacancies, but these fluxes are still metal-rich enough to accumulate droplets over time. The use of effusion cell shuttering periodically switches the growth between N-rich and Group-III metal-rich conditions, preferably maintaining an optimal substitutional site for Mg while still obtaining higher crystal growth quality associated with Group-III metal-rich growth. Embodiments of the present invention can significantly enhance Mg doping, resulting in hole concentrations in the $10^{19}$ cm$^{-3}$ range, which in some embodiments can be four (4) to forty (40) times higher than can be found in conventional growth methods. In some embodiments, reflection high-energy electron diffraction ("RHEED") intensity analysis can be used to allow for the observation and control of fractions of adsorbed metal monolayers and can also provide a method of in situ growth rate determination.

Figure 2:
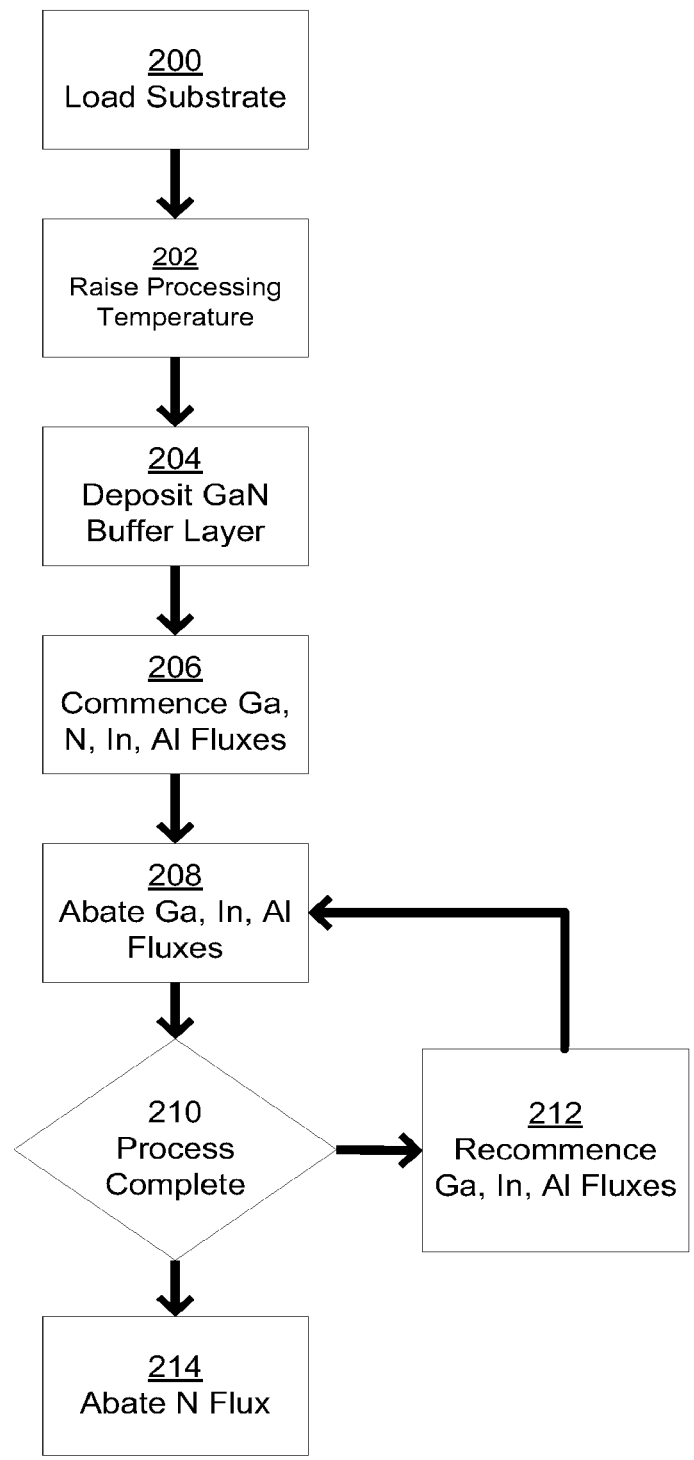
FIG. 2 illustrates an exemplary method for growing an aluminum-indium-gallium-nitride alloy, according to various embodiments of the present invention.

FIG. 2 is an exemplary process for forming an exemplary group-III Nitride semiconductor alloy, AlInGaN, according to various embodiments of the present invention. A substrate is loaded 200 into a processing chamber. In some embodiments, the substrate is SiC or sapphire but may also include, but is not limited to, zinc oxide, lithium gallate, lithium tantalite, silicon, germanium, and lithium niobate. Once the substrate is loaded 200 into a reaction chamber, the processing temperature of the reaction chamber is raised 202 to optimal processing temperatures. In some embodiments, the temperature can range from 250.degree. C. to 850.degree. C., and more preferably from 300.degree. C. to 800.degree. C., and most preferably from 350.degree. C. to 750.degree. C. The processing temperature can be raised in various ways including, but not limited to, heating elements placed on or near the substrate, heating elements placed within the reaction chamber, or heated gas.

Once the processing temperature is raised 202 to an optimal or desired level, a GaN buffer layer is deposited 204. It should be understood that the use of a GaN buffer layer is merely exemplary and is not intended to limit the scope of the present invention to just GaN buffer layers, or, even to the requirement of a buffer layer. Step 204 can comprise the use of various metal fluxes in addition to, or in substitution of, gallium. For example, step 204 can comprise the initiation of gallium, indium, or aluminum fluxes, or various combinations thereof, to produce various layers, including, but not limited to, active layers and buffer layers. The designation of a particular metal in step 204 is merely exemplary and only intended to illustrate one exemplary embodiment of the present invention.

Returning to FIG. 2, in some embodiments, the GaN buffer layer is deposited 204 by initiating a gallium flux and nitrogen flux, and thereafter, stopping and starting the gallium flux according to a flow duty cycle. In other embodiments, the GaN buffer layer is deposited via conventional deposition means such as MOCVD and MBE. Once GaN buffer layer is deposited 204 onto the substrate, growth of the aluminum-indium-gallium-nitride alloy commences by initiating 206 gallium, indium, aluminum, and nitrogen fluxes. In some embodiments, the transition from the formation of the GaN buffer layer to the AlInGaN alloy may be provided for by the initiation of the additional indium and aluminum fluxes. It should be understood that the incorporation of one or more gasses in step 206 is merely exemplary and not intended to limit the scope of the present invention to the use of the gasses designated. For example, step 204 can comprise the incorporation of one of the metal fluxes, e.g. gallium, indium, aluminum, or combinations thereof.

During the growth of the AlInGaN alloy, the metal fluxes, i.e. gallium, aluminum and indium, are abated 208. If the processing is complete 210, the nitrogen flux is then abated 214 and the process is complete. If the processing is not complete, the gallium, aluminum and indium fluxes are recommenced 212 for a period of time and then abated 208 again. The metal fluxes can be stopped through the use of various means, including the use of shutters placed on the outlets of the respective effusion cells. In some embodiments, the timing of the commencement and abatement of the flow of one or more of the metal fluxes constitute the flow duty cycle of the particular metal. If the group-III Nitride semiconductor being grown comprises one or more metals, the respective metal can have their individual duty cycles. For example, if the alloy to be grown is InGaN, the indium can have a first flow duty cycle and the gallium can have a second flow duty cycle, or vice versa. The flow duty cycles for each metal can be the same or can be altered, depending on the particular characteristics of the metal to be incorporated and any desired physical properties. For example, it may be advantageous to start and stop the indium and gallium fluxes at the same times. In another example, if one metal is preferred over the other, one flow duty cycle can be longer or shorter depending on the desired incorporation. In another example, a quaternary alloy, such as AlInGaN, can have a third flow duty cycle for the aluminum that can be the same as the first and/or second flow duty cycle.

The abatement 208 and restarting 212 of the gallium, aluminum and indium fluxes provides for the ability to grow the AlInGaN alloy in metal rich conditions while the shutters are open and gives the indium and/or aluminum time to incorporate into the AlInGaN alloy while the gallium, aluminum and indium fluxes are abated 208. Growth continues both in the abatement and non-abatement periods, providing a relatively high growth rate when compared to conventional growth methods. Further, because the infusion of aluminum and/or indium into the AlInGaN alloy is controlled via the use of shuttering, and the material is grown at relatively lower temperatures, various embodiments of the present invention provide for the ability to predict the indium and/or aluminum content of the AlInGaN alloy by the ratio of indium/aluminum to gallium flux. Finally, because the effects of thermal decomposition and spinodal decomposition, along with metal segregation, are reduced, the growth rate of AlInGaN alloy can be increased over conventional growth processes.

Experimental Results

In one experiment, a Riber 32 MBE system having standard effusion cells for indium and aluminum was used. To supply gallium, a Veeco SUMO effusion cell was used. A Veeco Unibulb plasma source was employed for nitrogen, and had a flow rate of 1.3 sccm at 350 W. Growth rates were approximately 800 nm/h for all InGaN growth reported herein. To provide a uniform starting point for all studies, Lumilog metal organic chemical vapor deposition grown GaN templates were used as substrates and were back-side sputtered with 1 .mu.m of tantalum ("Ta") to provide uniform heating. Substrates were cleaned in H.sub.2SO.sub.4: H.sub.2O.sub.2 (4:1) before being loaded into the introductory chamber and outgassed at 160.degree. C. for 30 minutes. The InGaN alloys were grown between 400.degree. C. and 450.degree. C. with metal-rich fluxes. Metal fluxes used were normalized based on atomic number to account for ion gauge sensitivity differences between In and Ga and were between 0.24 and 0.3.times.10.sup.-7 Torr normalized BEP.

Figure 3:
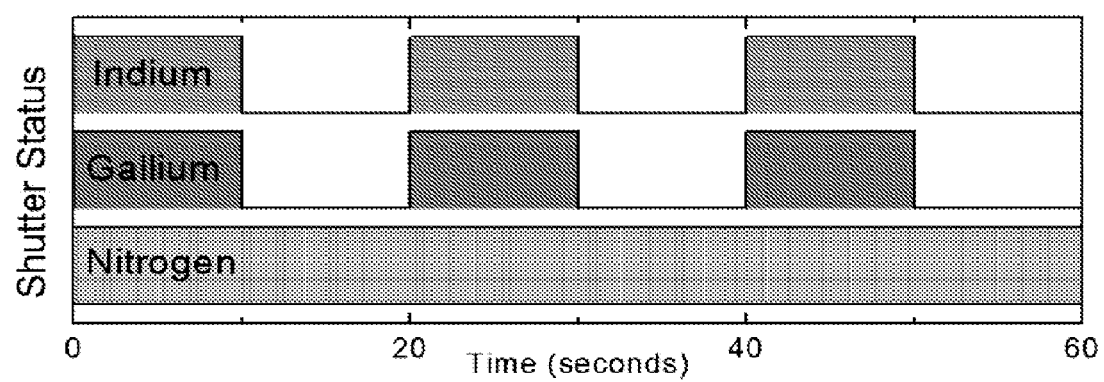
FIG. 3 is a graph showing an exemplary modulation scheme for the growth of an aluminum-indium-gallium-nitride alloy, according to various embodiments of the present invention.
Figure 4:
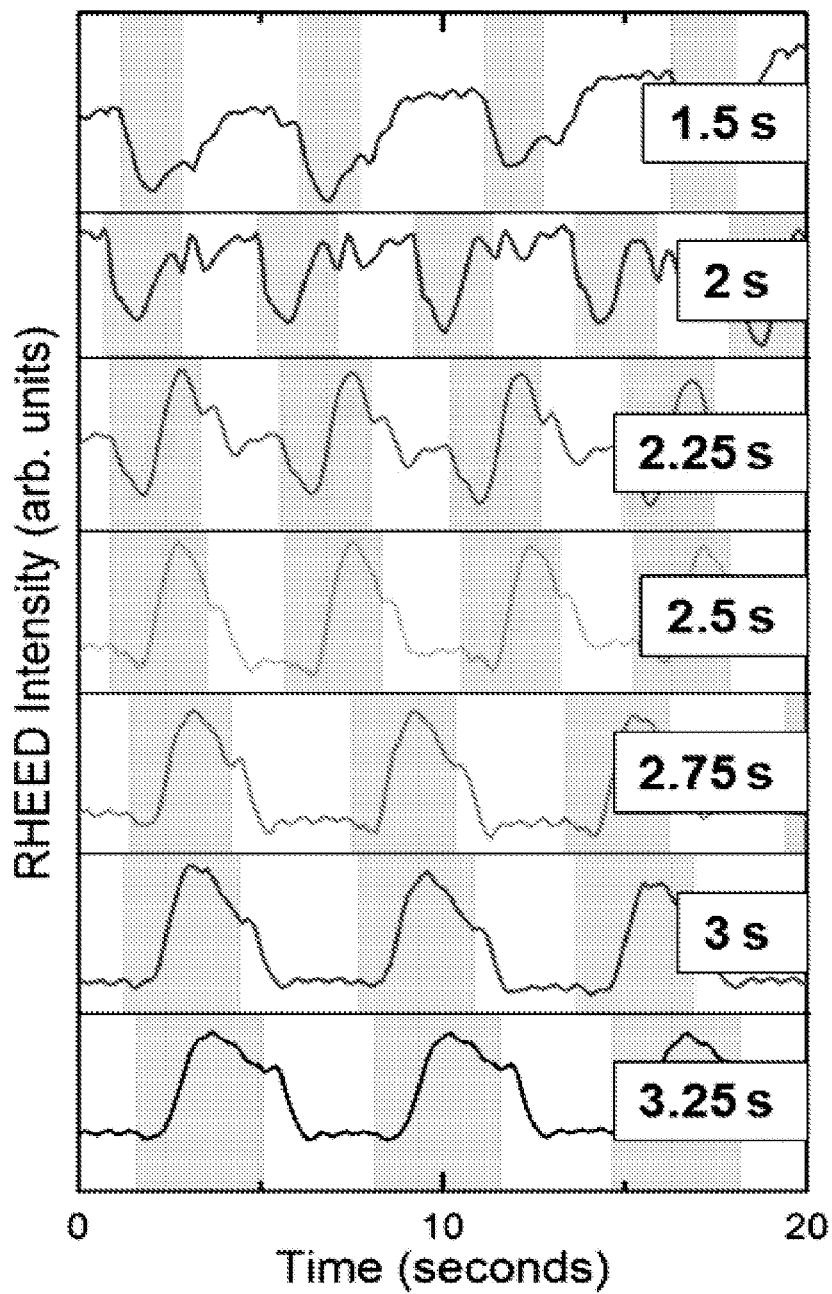
FIG. 4 is a graph showing transient reflection high-energy electron diffraction intensity versus time for various gallium and indium shutter open times, according to various embodiments of the present invention.

InGaN was grown using a flow duty cycle, i.e. shutter modulation, scheme similar to that illustrated in FIG. 3 and FIG. 4. The indium and gallium shutters are opened and closed simultaneously, while nitrogen remains constant. This shutter scheme was used to study the RHEED response of In/Ga adlayers, and to achieve metal-rich growth of InGaN while preferably preventing droplet buildup. FIG. 3 is an exemplary time graph illustrating the shuttering of the metal fluxes in relation to time. As shown, the nitrogen flux is maintained constant while the gallium and indium fluxes are shuttered. Samples were grown with differing metal shutter open times and indium to gallium ratios to characterize adatom kinetics of the growing InGaN surface. A range of indium compositions throughout the miscibility gap of InN—GaN were grown using conditions found during the experiment.

In FIG. 4, representative RHEED transients observed during the growth of 20% InGaN for several metal shutter open times from 1.5 seconds to 3.25 seconds are shown with shaded regions indicating metal shutters open. These transient RHEED intensities were determined from one growth for consistency, with GaN interlayers grown between each InGaN layer to consume residual indium from the intentional surface segregated conditions and to provide a smooth template to facilitate comparable initial growth conditions.

Several features across all shutter open times are apparent. First, a decrease of intensity on shutter open occurs, and is immediately followed by an increase in intensity. A flat, steady state intensity is also reached within a few seconds of metal shutter close which is visible across all shutter open times. Shutter-open-time-dependent features include a decreasing level of the steady-state intensity relative to a peak intensity observed during the shutter open period and an increasing width of a peak during the shutter open cycle for higher shutter open times. An expanded view of the 1.5 seconds, 2 seconds, and 2.75 seconds shutter open time RHEED transients are shown in FIG. 5 to help identify and explain specific features.

Figure 5:
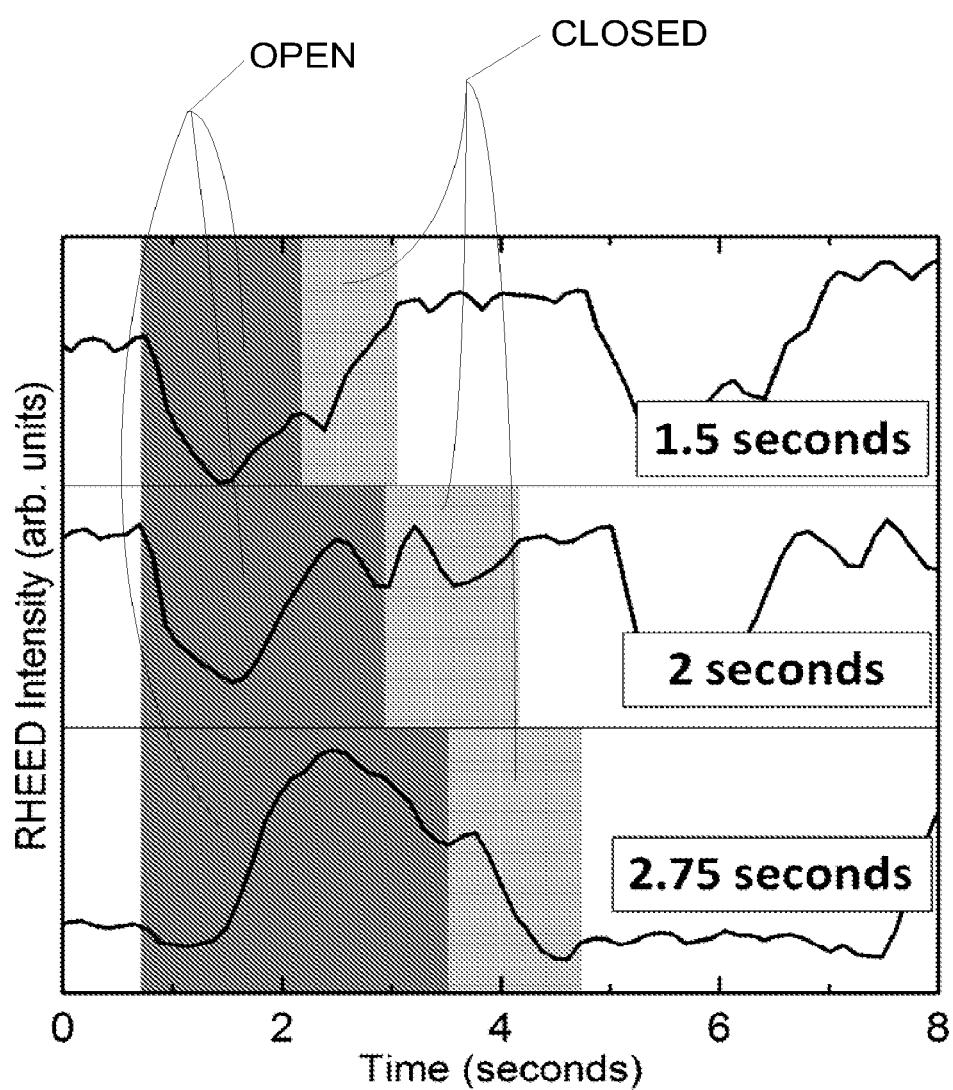
FIG. 5 is a graph showing an expanded view of the reflection high-energy electron diffraction intensity shown in FIG. 4.

Shown in FIG. 5 are expanded views of 3 transient RHEED signatures shown previously in FIG. 4. Specific features noted are colored in the shaded portion labeled "OPEN" and "CLOSED", where the OPEN region indicates metal shutter open time. The region labeled CLOSED is a signature observed after the metal shutters are closed. Following the CLOSED region is a section of relatively flat intensity described herein as a steady state period. It can be seen from both FIGS. 4 and 5 that for a given metal shutter open time in a modulation scheme, the transient RHEED intensity, in some embodiments, begins and returns to the same intensity, regardless of truncation.

Figure 6:
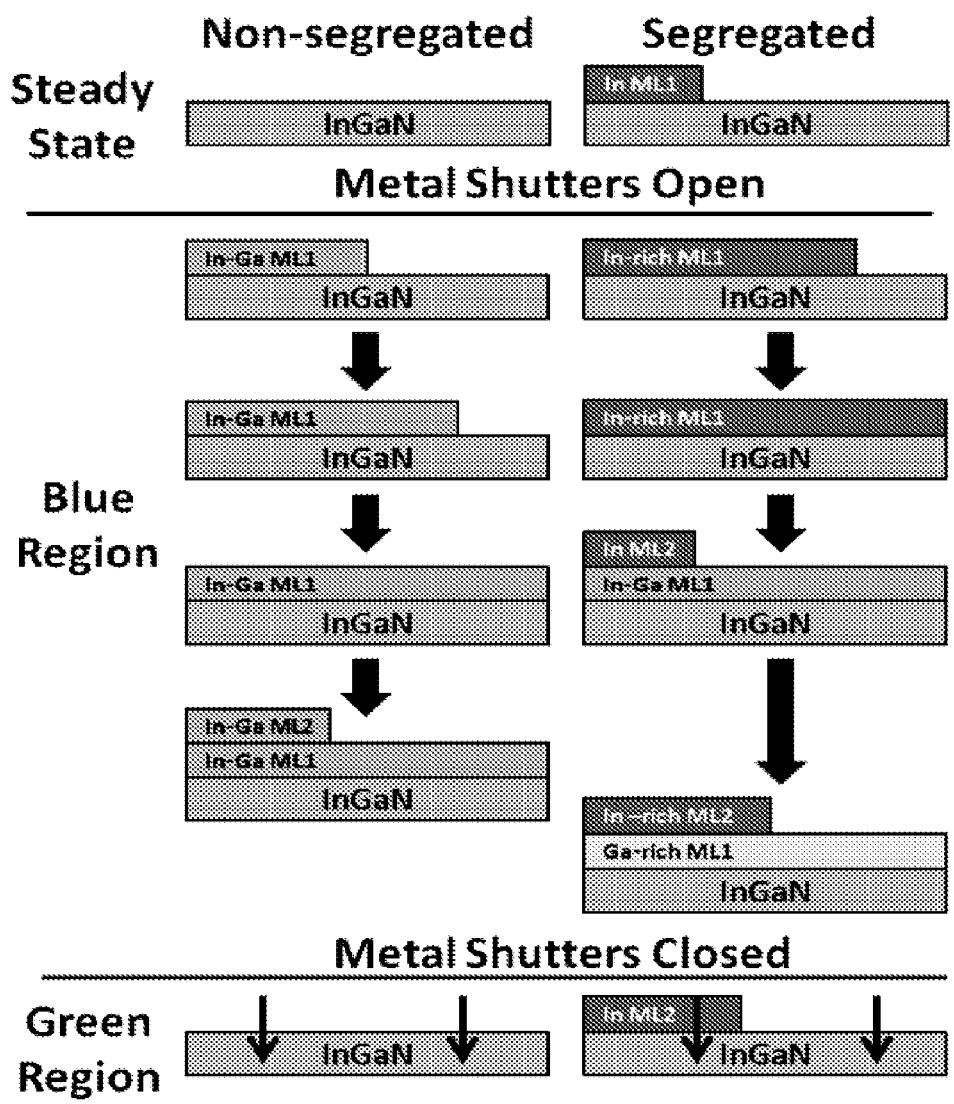
FIG. 6 illustrates the mechanism of indium surface segregation during the growth of an indium-gallium-nitride alloy, according to various embodiments of the present invention.
Figure 7A:
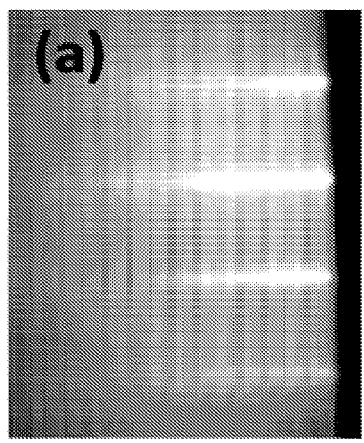
FIGS. 7a-c are reflection high-energy electron diffraction intensity patterns during shutter open time, low shutter open time, and high shutter open time, according to various embodiments of the present invention.

Focusing on the 2 second metal shutter open time section, the white region on the left side of the OPEN region is a flat RHEED intensity reached after a previous cycle and before metal shutters are opened that will be referred to as a steady state. Upon opening the metal shutters, an oscillatory function composed of the OPEN and CLOSED regions occur. This behavior is attributed to a RHEED oscillation associated solely on the adsorption of one metal monolayer (ML), where the minimum intensity is deconstructive interference caused by an incomplete layer, and the following maximum intensity is constructive interference caused by a complete layer. The remaining decrease in intensity is a continuation of this sinusoidal oscillation as the second monolayer of metal is adsorbed, but is truncated by the closing of the metal shutters, halting the supply of metal to the surface. After the metal shutters are closed, the CLOSED region occurs, which is another sinusoid that resembles the time-opposite of the OPEN region. This signature is attributed to the consumption of the adsorbed metal layer into the film. After the green region occurs, where adsorbed metal is consumed into the film, a steady state is again reached. An illustration of this process is shown in the non-segregated column of FIG. 6, and a characteristic RHEED pattern of a sample grown under these conditions is shown in FIG. 7(a), which confirms a flat, dry surface by the bright streaks.

Figure 7B:
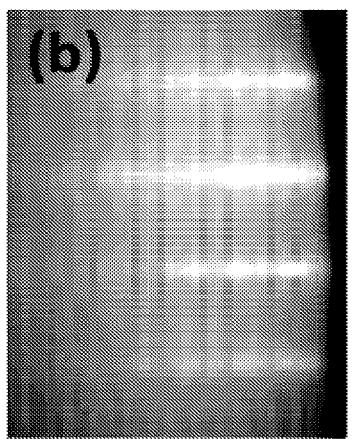

Next, the zoomed-in view of the 1.5 seconds shutter open time RHEED transient of FIG. 4 is examined, and is shown at the top of FIG. 5. This case is also non-surface segregated, and is similar to the 2 second metal shutter open time. With the use of a smaller shutter open time, a comparable RHEED oscillation is observed during the OPEN region after opening of the metal shutters. This oscillation similarly corresponds to the adsorption of the first monolayer of excess metal. However, the metal shutters are closed before a full oscillation takes place, which indicates truncation of excess metal accumulation before a full monolayer forms. Upon closing of the metal shutters, this excess metal is consumed into the film during the CLOSED region, and a signal that resembles the time opposite of the OPEN region occurs. Although this film exhibits no form of indium surface segregation, the lack of accumulation of a full adlayer limits the beneficial effects of the metal adlayer on surface smoothness. This roughness is demonstrated by both the gradual increase in RHEED intensity over time in FIGS. 4 and 5, and the spotty RHEED pattern in FIG. 7(b). An illustration of this process is shown in the non-segregated column of FIG. 6 excluding the bottom two steps in the OPEN region.

Figure 7C:
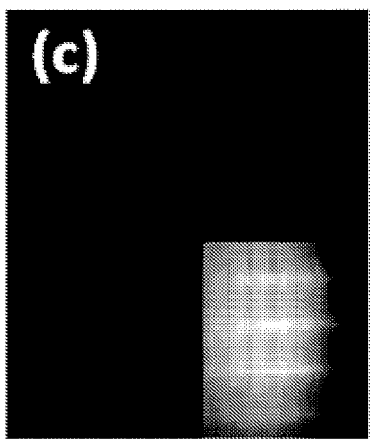

Finally, the zoomed-in view of the RHEED transient with the 2.75 second shutter open time is considered and shown in FIG. 5. Before analyzing transient RHEED intensities of this case, it can be important to determine the qualitative condition of the steady state period between modulation cycles, shown by the white region on the left. In this case, excess metal is supplied to the adlayer in a previous modulation cycle that indium surface segregation has occurred, resulting in indium atoms riding on top of the rest of the adsorbed metal. Upon consumption of the adlayer, residual indium metal remains on the surface, as indium nitride typically does not form in these experimental conditions at the substrate temperatures used for these growths. The presence of indium is supported by the diffuse RHEED pattern visible during the shutter closed portion of the modulation scheme, shown in FIG. 7(c). It should be noted that specified open times vary with targeted composition, flux flow rate, and substrate temperature, and that the illustrated shutter open times are merely exemplary.

Upon opening the metal shutters in the blue region of the 2.75 second shutter open time transient in FIG. 5, the RHEED intensity quickly decreases to a minimum before steadily increasing again to a maximum. The time elapsed until reaching the minimum intensity is reduced in this case compared to the transients with smaller shutter open times in FIG. 4. Furthermore, the intensity during the steady state period is also decreased. These features are concurrent with the conclusion that indium is already present on the surface. The deconstructive interference produced by this incomplete layer results in a phase shift in the sinusoid associated with the RHEED oscillation. The behavior of the RHEED intensity after opening the metal shutters is then attributed to an oscillatory function associated with the continued accumulation of one monolayer of excess metal. Since only indium may be present as all residual gallium would have been consumed, it can be expected that this newly assembled adlayer is indium-rich, potentially forming In-rich InGaN.

The RHEED intensity then continues to increase as the first ML begins to finish. However, the analysis of the RHEED transients becomes more complex than constructive/deconstructive interference considerations when gallium begins to replace indium for surface sites. As the first ML finishes and further impingent metal cannot spread laterally, a second monolayer begins to form. In this case, incoming gallium atoms will preferentially displace indium atoms in the indium-rich first monolayer. This process provides an increase in intensity after the first monolayer forms, as gallium has been shown to scatter the RHEED beam less than indium. The second monolayer is also able to hold more metal than the first monolayer, which causes a decrease in frequency of the sinusoidal RHEED oscillation. These two effects produce a tall, broad peak in the RHEED intensity just after one ML of excess metal accumulation. The substitution of gallium for indium on surface sites will also affect the composition of the growing InGaN film, producing indium-lean material. Combined with the growth of indium-rich InGaN from a mostly indium adlayer at the beginning of the modulation scheme, this surface-segregated growth can produce a multi-phase material.

After the metal shutters are closed, the CLOSED region occurs, resembling a faster, time-opposite of the OPEN region. Similarly to the CLOSED regions of the smaller shutter open times, this period of the transient RHEED intensity indicates consumption of adlayer material into the film. However, in this case, indium has been displaced by gallium to the second monolayer, and the adlayer as a whole is no longer homogenous. As the adlayer is consumed, the indium-lean first monolayer incorporates first, leaving mostly indium on the surface. At the temperatures used for this growth InN would likely not form in these experimental conditions. This process leaves residual indium on the surface during the steady state period, which contributes to the diffuse RHEED pattern shown in FIG. 7(c) and a decreased RHEED intensity shown in FIGS. 4 and 5. An illustration of this process is shown in FIG. 6 under the surface segregated column.

Thus, indium surface segregation is linked to adlayer accumulation on the growth surface as opposed to metal-rich growth in general. By limiting the quantity of this adlayer, surface segregation can be inhibited and metal-rich growth of InGaN can be conducted. However, the thickness of this adlayer can be limited too much, hindering the smoothing effect of a wetting layer and resulting in a rough film as shown by the spotty RHEED pattern in FIG. 7(b). It then can become important to identify the exact thickness of excess metal required to induce surface segregation, and adsorb as close to that thickness as possible during each modulation scheme.

If indium surface segregation has occurred, some of the metal supplied during the metal shutter open time may not incorporate into the film. This effect can result in a smaller time required to reach a steady state after the metal shutters are closed relative to a non-segregated growth condition. This experiment is performed both to determine the exact amount of metal required to induce surface segregation, herein called the surface segregation onset dose, and to strengthen the theory suggested in the qualification section above. To extract the thickness of the consumed layer, a general MBE growth equation is considered. The relationship between growth rate, incoming metal flux, adlayer accumulation, and adlayer desorption can be described with Equation (1):

$$R_{Flux} = R_{Growth} + R_{Adlayer} + R_{Desorption} \qquad \text{Equation (1)}$$

where $R_{Flux}$ is the rate of incoming flux, $R_{Growth}$ is the rate of film growth, $R_{Adlayer}$ is the rate of adlayer accumulation, and $R_{Desorption}$ is the rate of adatom desorption from the surface. The low temperatures used for the growth of these InGaN samples allows for the assumption that desorption of the adlayer is negligible. Furthermore, when the metal shutters are closed, the flux term can be eliminated which leaves Equation (2):

$$R_{Growth} = R_{Adlayer} \qquad \text{Equation (2)}$$

Equation (2) has been used to determine growth rate from the consumption of the known thickness of the bilayer in GaN (2.3 ML). It can also be used in this case for a known growth rate to determine the thickness of an unknown adlayer on the surface of the growing InGaN film, by Equation (3):

$$R\,Growth = -(D\,Adlayer\,t\,accumulation) = D\,Adlayer\,t\,consumption \qquad \text{Equation (3)}$$

where $D_{Adlayer}$ is the thickness of the incorporated adlayer, and $t_{consumption}$ is the time required to consume this adlayer. It has been calculated that this composition of about 20% InGaN has a growth rate of approximately 800 nm/hr for a particular modulation scheme. However, this growth rate takes into account the steady-state time between modulation schemes, shown by the flat, unshaded regions in FIGS. 4 and 5 where no growth occurs.

Furthermore, this measure of growth rate is dependent on each particular modulation scheme. If the steady-state period is eliminated by only considering the time where metal is present during growth, the film has been calculated to grow at approximately 900 nm/hr. This allows for a modulation-independent calculation of the thickness of the adlayer consumed into the film during the metal shutter closed period. With a known growth rate and a measurable time of adlayer consumption, the thickness of this consumed adlayer can be calculated and converted to monolayers.

The CLOSED region of FIG. 5, the time to consume the metal adlayer, was monitored for two indium compositions and several metal shutter open times. The derivatives of the RHEED intensity plots were used to consistently highlight when flat, steady state was reached. The length of time of this region and shutter open times were averaged for several modulation cycles and plotted in FIG. 8. The secondary y-axis of FIG. 8 is the thickness of the metal adlayer accumulated onto the film calculated from the time elapsed to consume this adlayer.

Figure 8:
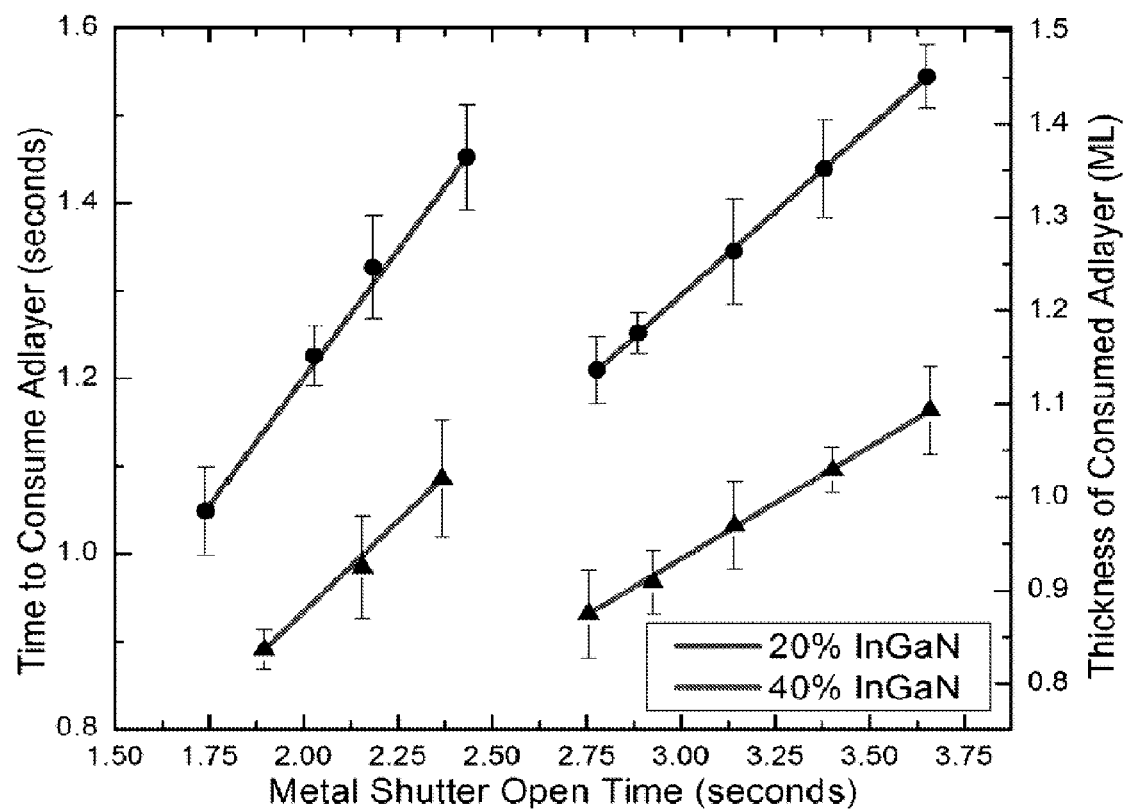
FIG. 8 illustrates the time of consumption of metal adlayer and the corresponding metal adlayer thickness versus gallium and indium shutter open time for the conditions shown in FIG. 4.

Shown in FIG. 8 are both the time of consumption and thickness of the metal adlayer for several metal shutter open times during the growth of 20% and 40% InGaN. For both indium compositions, the time to consume the metal adlayer increases linearly until a certain metal shutter open time. After this point, the time to consume the adlayer decreases to a lower value, then linearly increases at a different slope than before. This break in linearity is attributed to the onset of indium surface segregation, which causes indium to segregate on top of the gallium in the adlayer. In a segregated case, once the gallium-rich first monolayer of the adlayer is consumed, mostly indium remains on the surface and is prevented from incorporating into the film due to the substrate temperature being greater than needed for InN decomposition. This would cause the steady state regions shown in FIGS. 4 and 5 to be reached sooner since the thickness of the adlayer that can consume into the film is effectively decreased.

The existence of a surface segregation onset dose (1-2 ML) less than the droplet accumulation thickness (2-2.5 ML) is significant. Because an intermediate regime does not exist at these low temperatures, unshuttered MBE growth will either produce droplets or result in dry, nitrogen rich growth. Thus, the present invention uses modulation to grow high-quality, metal-rich InGaN growth. The modulation (or shuttering) provides for the accumulation of a certain amount of excess metal for its beneficial effects while preventing indium surface segregation.

Figure 9:
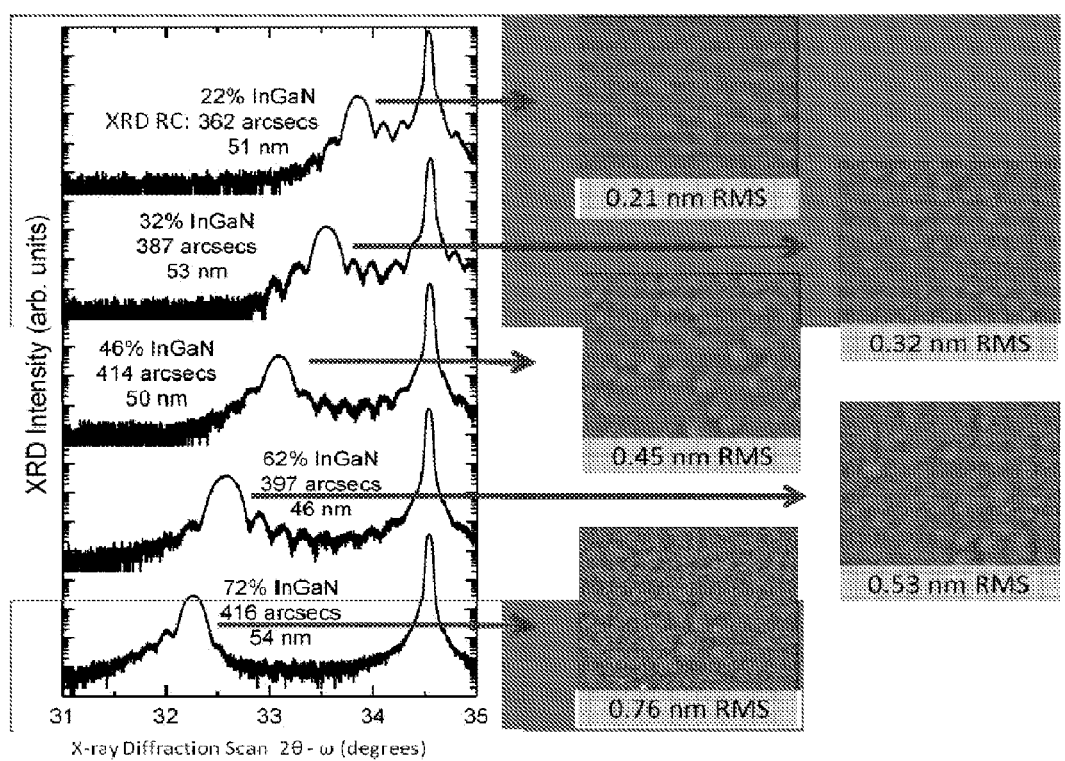
FIG. 9 are X-ray diffraction scans, rocking curves, and corresponding atom force microscope morphologies of indium-gallium-nitride layers grown throughout the miscibility gap, according to various embodiments of the present invention.
Figure 10:
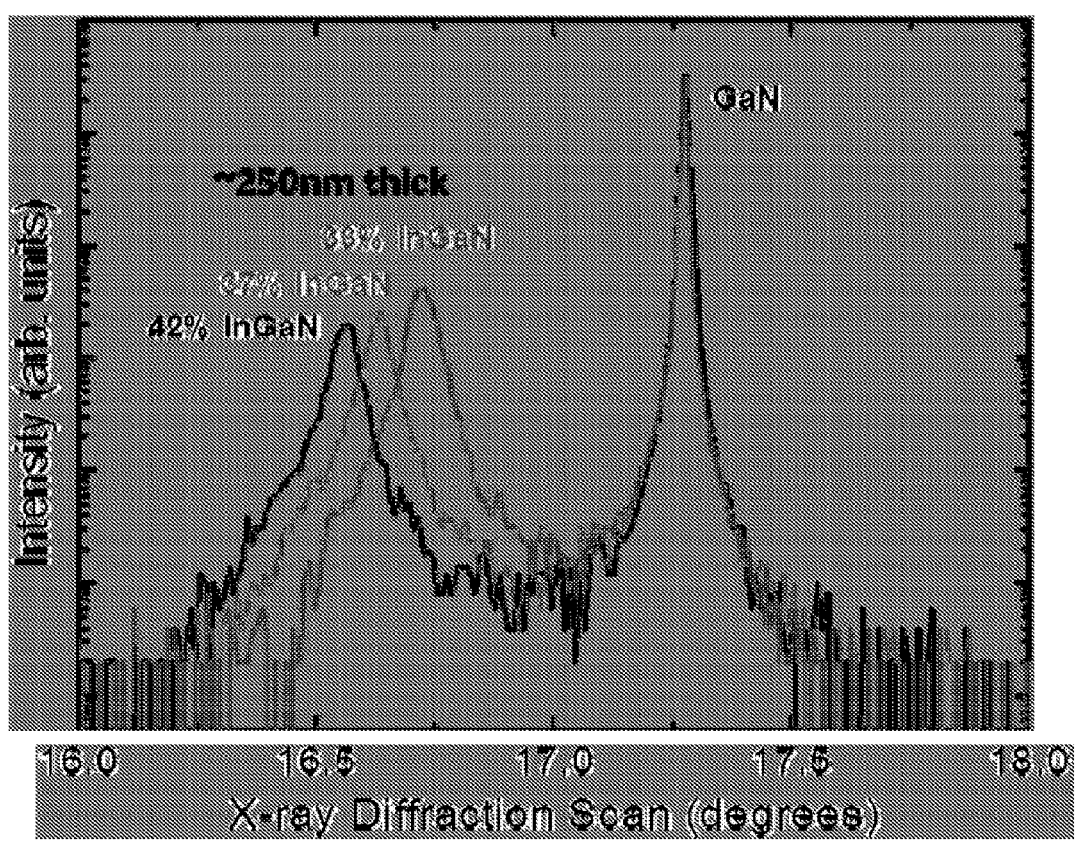
FIG. 10 are X-ray diffraction scans of independently grown indium-gallium-nitride layers, according to various embodiments of the present invention.

The understanding and suppression of indium surface segregation has enabled higher indium content films to be grown when compared to conventional growth processes, and within the InN—GaN miscibility gap. Shown in FIG. 9 are x-ray diffraction scans of InGaN samples with varying indium contents from 22% to 72% and associated rocking curve full widths at half maximum (FWHM) for the <0002> symmetric reflections. Atomic force microscopy images with 30 nm height scales are shown on the right with inset root-mean-square roughnesses. Film thicknesses were measured from the thickness fringes visible in the x-ray diffraction scan for all samples. Each of the samples shown in FIG. 9 exhibit single phase x-ray diffraction spectra with rocking curve FWHMs comparable to the GaN templates used to substrate these films (.about.350 arcseconds). Shown in FIG. 10 are x-ray diffraction scans of single-phase InGaN samples, all with thicknesses of approximately 250 nm.

Figure 11:
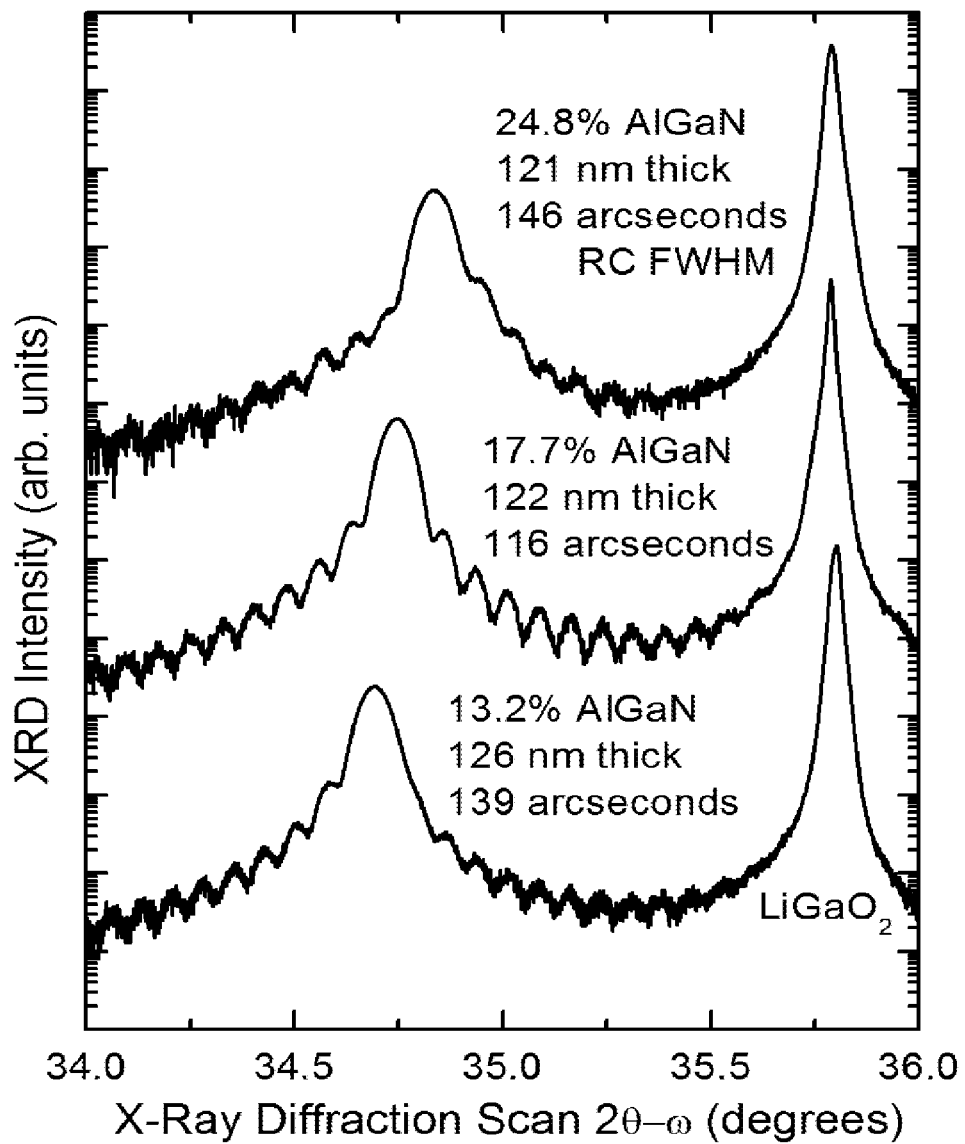
FIG. 11 are X-ray diffraction scans of AlGaN alloys having varying aluminum contents, grown according to various embodiments of the present invention.

This process has also been shown to be successful for AlGaN alloys, which are used for ultraviolet light emitters. Shown in FIG. 11 are x-ray diffraction scans of AlGaN samples with varying indium contents from 13% to 25% and associated rocking curve full widths at half maximum (FWHM) for the <0002> symmetric reflections. Film thicknesses were measured from the thickness fringes visible in the x-ray diffraction scan for all samples. Each of the samples shown in FIG. 11 exhibit single phase x-ray diffraction spectra.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

We claim:

1. A single-phase, group-III Nitride film comprising the formula $In_xM_{1-x}N$,
    wherein x is from about 37% to about 72%;
    M comprises gallium, aluminum or a mixture thereof; and
    the film is free of phase separation.

2. The group-III Nitride film of claim 1, wherein x is from about 45% to about 72%.

3. The group-III Nitride film of claim 1, wherein x is from about 37% to about 45%.

4. The group-III Nitride film of claim 1, wherein M is gallium.

5. The group-III Nitride film of claim 4, wherein M further comprises aluminum.

6. The group-III Nitride film of claim 1, wherein the film is free of surface defects and surface pitting.

7. The group-III Nitride film of claim 1, wherein an x-ray diffraction rocking curve of the film is less than about 416 arcseconds.

8. The group-III Nitride film of claim 1, wherein an x-ray diffraction rocking curve of the film is less than about 362 arcseconds.

9. The group-III Nitride film of claim 1, wherein a root-mean-square roughness of the film as measured by atomic force microscopy is less than about 0.76 nanometers.

10. The group-III Nitride film of claim 1, wherein a root-mean-square roughness of the film as measured by atomic force microscopy is less than about 0.53 nanometers.

11. A single phase group-III Nitride film comprising:
    aluminum in an amount from about 13.2% to about 24.8%; and
    gallium;
        wherein the film is free of surface defects and surface pitting, and wherein an x-ray diffraction rocking curve of the film is less than about 146 arcseconds.

12. The group-III Nitride film of claim 11, further comprising indium.

13. The group-III Nitride film of claim 12, wherein the film is free of phase separation.

* * * * *

UNITED STATES PATENT AND TRADEMARK OFFICE
CERTIFICATE OF CORRECTION

PATENT NO. : 10,000,381 B2
APPLICATION NO. : 14/860226
DATED : June 19, 2018
INVENTOR(S) : Michael William Moseley and William Alan Doolittle Page 1 of 1

It is certified that error appears in the above-identified patent and that said Letters Patent is hereby corrected as shown below:

In the Specification

Column 1, Line 5, please insert:
-- STATEMENT REGARDING FEDERALLY SPONSORED RESEARCH
This invention was made with U.S. government support under Contract No. ECCS0702521 awarded by the National Science Foundation and Contract No. FA9550-10-1-0012 awarded by the United States Air Force. The U.S. government has certain rights in the invention. --

Signed and Sealed this
Sixteenth Day of October, 2018

Andrei Iancu
*Director of the United States Patent and Trademark Office*